United States Patent
Kim et al.

(10) Patent No.: US 8,305,320 B2
(45) Date of Patent: Nov. 6, 2012

(54) LIQUID CRYSTAL DISPLAY AND TWO-FRAME OVERDRIVING METHOD USING LSB TO INDICATE MODULATION STATUS

(75) Inventors: Gihong Kim, Gyeonggi-do (KR); Jaekyeong Yun, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 662 days.

(21) Appl. No.: 12/546,967

(22) Filed: Aug. 25, 2009

(65) Prior Publication Data

US 2010/0141638 A1 Jun. 10, 2010

(30) Foreign Application Priority Data

Dec. 4, 2008 (KR) .......................... 10-2008-122687

(51) Int. Cl.
*G09G 3/36* (2006.01)
*G09G 5/00* (2006.01)
*G06F 3/038* (2006.01)

(52) U.S. Cl. .......................................... 345/94; 345/690
(58) Field of Classification Search ............. 345/87–104
See application file for complete search history.

(56) References Cited

U.S. PATENT DOCUMENTS

| | | | |
|---|---|---|---|
| 2004/0012551 A1* | 1/2004 | Ishii | 345/87 |
| 2005/0073630 A1* | 4/2005 | Chen et al. | 349/87 |
| 2005/0225522 A1* | 10/2005 | Wu et al. | 345/87 |
| 2007/0285366 A1* | 12/2007 | Ha et al. | 345/87 |
| 2008/0129668 A1* | 6/2008 | Ham et al. | 345/87 |
| 2008/0259059 A1* | 10/2008 | De Greef | 345/204 |
| 2009/0021499 A1* | 1/2009 | Chen et al. | 345/204 |

* cited by examiner

*Primary Examiner* — Chanh Nguyen
*Assistant Examiner* — Navin Lingaraju
(74) *Attorney, Agent, or Firm* — Morgan, Lewis, Bockius LLP (57) ABSTRACT

A liquid crystal display and a driving method thereof are provided. The liquid crystal includes a liquid crystal display panel, a data driving circuit, a gate driving circuit, a timing controller, and an over-driving controller. The over-driving controller, if a difference between input data input during a (N)th frame period (N is a positive integer) and (N−1)th frame data read from a memory is more than 2 gray levels, modulates the data at an over/under shoot ratio of 20 to 80% and supplies the modulated data to the timing controller, if the difference is less than 2 gray levels, differently supplies the input data to the timing controller and converts the least significant bit of the data stored in the memory according to whether or not the data is modulated.

8 Claims, 11 Drawing Sheets

FIG. 1

RELATED ART

FIG. 2

RELATED ART

FIG. 3

RELATED ART

LIQUID CRYSTAL DISPLAY AND TWO-FRAME OVERDRIVING METHOD USING LSB TO INDICATE MODULATION STATUS

This application claims the benefit of Korean Patent Application No. 10-2008-122687 filed on Dec. 4, 2008, which is incorporated herein by reference for all purposes as it fully set forth herein.

BACKGROUND OF THE INVENTION

1. Field of the Invention

This document relates to a liquid crystal display and a method for driving the same.

2. Discussion of the Related Art

Flat panel displays include a liquid crystal display (LCD), a field emission display (FED), a plasma display panel (PDP), an organic light emitting display (OLED), etc.

Since the LCD satisfies the trend toward lightweight, thin, short and small electric appliances and has improved mass productivity, cathode ray tubes have been rapidly replaced with LCDs in many applications. An active matrix type LCD which drives liquid crystal cells using thin film transistors (hereinafter, referred to as "TFTs") has excellent picture quality and low power consumption, has been rapidly developed to realize an increase in size and a high resolution by a recent mass production technology and the results of research and development, and has been quickly replacing cathode ray tubes in television sets (hereinafter, TVs) and monitors. However, the LCD has a relatively low response speed due to characteristics such as the inherent viscosity and elasticity of liquid crystal, as can be seen from the following equations 1 and 2:

$$\tau_T \propto \frac{\gamma d^2}{\Delta\varepsilon |V_a^2 - V_F^2|} \quad \text{[Equation 1]}$$

where $\tau r$ is a rising time when a voltage is applied to the liquid crystal, Va is the applied voltage, VF is a Freederick transition voltage at which liquid crystal molecules start to be inclined, d is a liquid crystal cell gap, and $\gamma$ is the rotational viscosity of the liquid crystal molecules.

$$\tau_f \propto \frac{\gamma d^2}{K} \quad \text{[Equation 2]}$$

where $\tau f$ is a falling time when the liquid crystal is returned to its original position after the voltage applied to the liquid crystal is turned off, and K is the inherent elastic modulus of the liquid crystal.

In a twisted nematic (TN) mode which has been mostly commonly used in liquid crystal displays, although the response speed of the liquid crystal may be different according to the physical properties and cell gap of the liquid crystal, it is common that the rising time is 20 ms to 80 ms and the falling time is 20 ms to 30 ms. Because this liquid crystal response speed is longer than one frame period (16.67 ms in National Television Standards Committee (NTSC)), the response of the liquid crystal proceeds to the next frame before a voltage being charged on the liquid crystal reaches a desired level, as shown in FIG. 1, resulting in motion blurring in a moving image.

Figure 1:
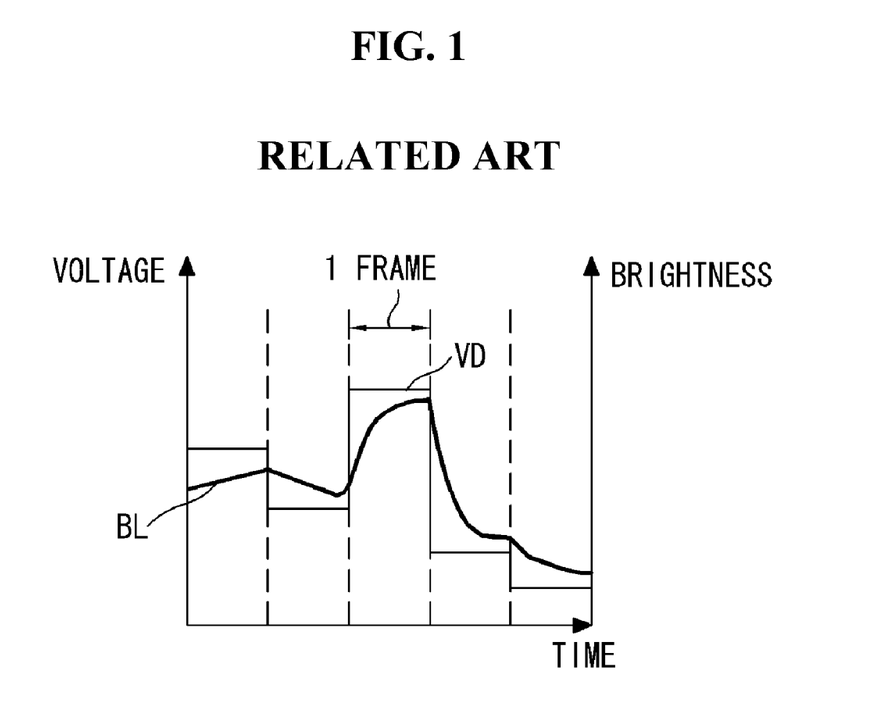
FIG. 1 is a waveform diagram representing a brightness change in accordance with data in a liquid crystal display of the prior art.

With reference to FIG. 1, a liquid crystal display device cannot express a desired color and brightness in that, when data VD is changed from one level to another level, the corresponding display brightness level BL is unable to reach a desired value due to the slow response of the liquid crystal. As a result, motion blurring occurs in the moving image, causing degradation in display quality.

In order to solve the low response speed of the liquid crystal display, U.S. Pat. No. 5,495,265 and PCT International Publication No. WO 99/05567 have proposed a method for modulating data according to a variation therein using a look-up table (referred to hereinafter as an 'over-driving method (ODC)'). This over-driving method is adapted to modulate data on the basis of a principle as illustrated in FIG. 2.

Figure 2:
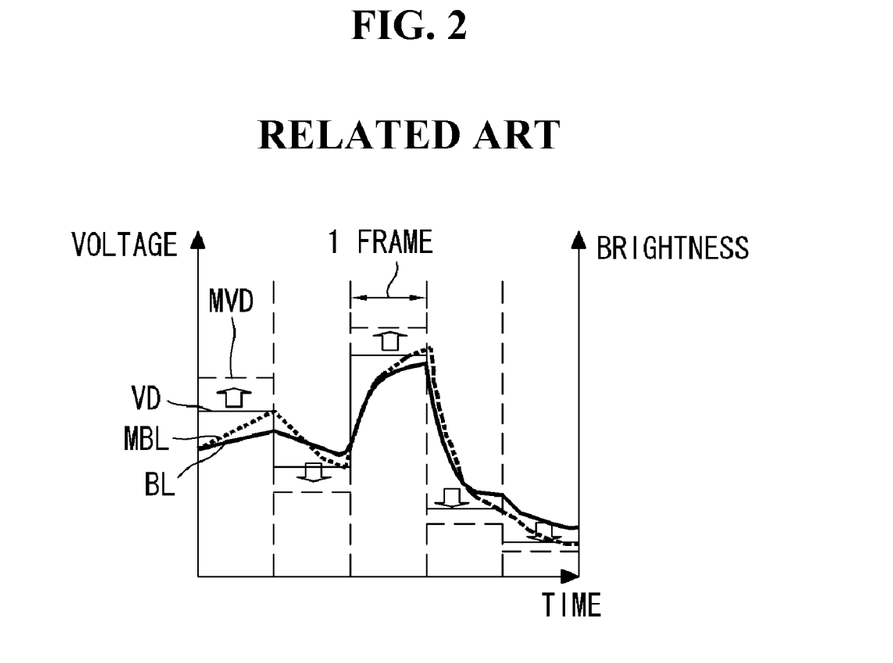
FIG. 2 is a waveform diagram representing an example of the brightness change in accordance with data modulation in an over-driving method.

With reference to FIG. 2, the over-driving method includes modulating an input data voltage VD to a preset modulated data voltage MVD and applying the modulated data voltage MVD to a liquid crystal cell to obtain a desired brightness level MBL. In this over-driving method, in order to obtain the desired brightness level in one frame period, $V^2_a - V^2_F$ of Equation 1 is increased on the basis of a variation in the input data. Accordingly, a liquid crystal display using the over-driving method is able to compensate for a slow response of a liquid crystal by modulation of a data value to reduce motion blurring in a moving image.

Figure 3:
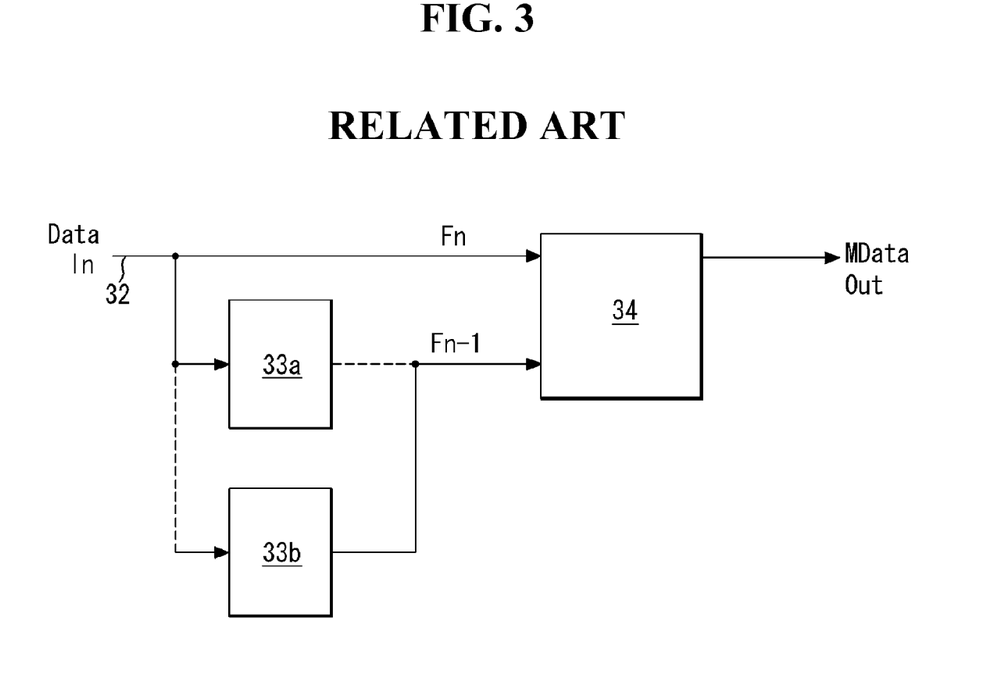
FIG. 3 is a circuit diagram representing an over-driving circuit.

In this over-driving method, data of a previous frame and current frame are compared with each other, and if there is any change between the data, the data of the current frame is modulated to a preset modulation data FIG. 3 is a block diagram schematically showing an over-driving circuit.

Referring to FIG. 3, the over-driving circuit includes first and second frame memories 33a and 33b for storing data from a data input bus 32 and a look-up table 34 for modulating data.

The first and second frame memories 33a and 33b alternately store the data input from the data input bus 32 in a frame unit in accordance with a pixel clock, and then alternately output the stored data to supply a previous frame data, i.e., (n−1)th frame data Fn−1 to the look-up table 34.

The look-up table 34 selects a preset modulation data MRGB from the following Table 1 by using the (n)th frame data Fn and the (n−1)th frame data Fn−1 from the first and second frame memories 33a and 33b as the address, thereby modulating the data. The lookup table 34 includes a read only memory ROM and a memory control circuit.

TABLE 1

|   | 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | 0 | 2 | 3 | 4 | 5 | 6 | 7 | 9 | 10 | 12 | 13 | 14 | 15 | 15 | 15 | 15 |
| 1 | 0 | 1 | 3 | 4 | 5 | 6 | 7 | 8 | 10 | 12 | 13 | 14 | 15 | 15 | 15 | 15 |
| 2 | 0 | 0 | 2 | 4 | 5 | 6 | 7 | 8 | 10 | 12 | 13 | 14 | 15 | 15 | 15 | 15 |
| 3 | 0 | 0 | 1 | 3 | 5 | 6 | 7 | 8 | 10 | 11 | 13 | 14 | 15 | 15 | 15 | 15 |
| 4 | 0 | 0 | 1 | 3 | 4 | 6 | 7 | 8 | 9 | 11 | 12 | 13 | 14 | 15 | 15 | 15 |
| 5 | 0 | 0 | 1 | 2 | 3 | 5 | 7 | 8 | 9 | 11 | 12 | 13 | 14 | 15 | 15 | 15 |

TABLE 1-continued

|    | 0 | 1 | 2 | 3 | 4 | 5 | 6 | 7 | 8 | 9 | 10 | 11 | 12 | 13 | 14 | 15 |
|----|---|---|---|---|---|---|---|---|---|---|----|----|----|----|----|----|
| 6  | 0 | 0 | 1 | 2 | 3 | 4 | 6 | 8 | 9 | 10 | 12 | 13 | 14 | 15 | 15 | 15 |
| 7  | 0 | 0 | 1 | 2 | 3 | 4 | 5 | 7 | 9 | 10 | 11 | 13 | 14 | 15 | 15 | 15 |
| 8  | 0 | 0 | 1 | 2 | 3 | 4 | 5 | 6 | 8 | 10 | 11 | 12 | 14 | 15 | 15 | 15 |
| 9  | 0 | 0 | 1 | 2 | 3 | 4 | 5 | 6 | 7 | 9  | 11 | 12 | 13 | 14 | 15 | 15 |
| 10 | 0 | 0 | 1 | 2 | 3 | 4 | 5 | 6 | 7 | 8  | 10 | 12 | 13 | 14 | 15 | 15 |
| 11 | 0 | 0 | 1 | 2 | 3 | 4 | 5 | 6 | 7 | 8  | 9  | 11 | 13 | 14 | 15 | 15 |
| 12 | 0 | 0 | 1 | 2 | 3 | 4 | 5 | 6 | 7 | 8  | 9  | 10 | 12 | 14 | 15 | 15 |
| 13 | 0 | 0 | 1 | 2 | 3 | 3 | 4 | 5 | 6 | 7  | 8  | 10 | 11 | 13 | 15 | 15 |
| 14 | 0 | 0 | 1 | 2 | 3 | 3 | 4 | 5 | 6 | 7  | 8  | 9  | 11 | 12 | 14 | 15 |
| 15 | 0 | 0 | 0 | 1 | 2 | 3 | 3 | 4 | 5 | 6  | 7  | 8  | 9  | 11 | 13 | 15 |

In the Table 1, the leftmost column represents the data of the previous frame Fn−1 and the uppermost row represents the data of the current frame Fn.

During an (n) th frame period, as represented by a solid line, the (n)th frame data Fn is stored in the first frame memory 33a and supplied to the look-up table 34 in accordance with the same pixel clock. At the same time, for a (n)th frame period, the second frame memory 33b supplies the (n−1)th frame data Fn−1 to the look-up table 34.

On the other hand, for a (n+1)th frame period, as represented by a dotted line, the current (n+1)th frame data Fn+1 is stored in the second frame memory 33b and simultaneously supplied to the look-up table 34 in accordance with the same pixel clock. At the same time, for a (n+1)th frame period, the first frame memory 33a supplies the (n) th frame data Fn to the look-up table 34.

However, although the over-driving method may enhance motion picture response time further by increasing over/under shoot ratio, picture quality may be degraded due to motion blurring occurring at a liquid crystal charging voltage.

SUMMARY OF THE INVENTION

Accordingly, the present invention has been made to solve the above-mentioned problems occurring in the prior art, and an aspect of the present invention is to provide a liquid crystal display and a driving method thereof, which increases the improvement effect of motion picture response time without an additional memory.

To achieve the above aspect, there is provided a liquid crystal display according to the present invention, including: a liquid crystal display panel including a plurality of data lines, a plurality of gate lines crossing the data lines, and a plurality of liquid crystal cells; a data driving circuit for supplying data voltages to the data lines; a gate driving circuit for supplying gate pulses to the gate lines; a timing controller for supplying data to the data driving circuit and controlling the data driving circuit and the gate driving circuit; and an over-driving controller which, if a difference between input data input during a (N)th frame period (N is a positive integer) and (N−1)th frame data read from a memory is 2 gray levels or more, modulates the data at an over/under shoot ratio of 20% to 80% and supplies the modulated data to the timing controller, if the difference is less than 2 gray levels, supplies the input data to the timing controller, and differently converts a least significant bit of the data stored in the memory according to whether or not the data is modulated.

There is provided a driving method of a liquid crystal display according to an exemplary embodiment of the present invention, including: if a difference between input data input during a (N)th frame period (N is a positive integer) and (N−1)th frame data read from a memory is 2 gray levels or more, modulating the data at an over/under shoot ratio of 20% to 80% and supplying the modulated data to the timing controller; if the difference is less than 2 gray levels, supplying the input data to the timing controller, and differently converting the least significant bit of the data stored in the memory according to whether or not the data is modulated.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

The above and other aspects and features of the present invention will become more apparent by describing an exemplary embodiment thereof with reference to the attached drawings.

Table 2 is an experimental result of measurement of the motion picture response time (MPRT) of liquid crystal at an over/under shoot ratio of 10%. Table 3 is an experimental result of evaluation of an improvement effect of the motion picture response time of liquid crystal when the over/under shoot ratio is increased to 50% by increasing a modulation width of data. The over/under shoot ratio (%) is defined as a brightness ratio between a target brightness B and a brightness of a modulation voltage when data is modulated to the modulation voltage with a brightness level higher than the target brightness B so that a brightness A is reached to the target brightness B within a short time in case that a brightness A is changed to the target brightness B. For example, when brightness A is '0' and brightness B is '100', a voltage of brightness B is modulated to a brightness voltage of '150' in a method of over-driving at an over/under shoot ratio of 50%. In this experiment, a time required for the liquid crystal cell to reach a target brightness when a finish voltage (Fini.) is applied to the liquid crystal cell after application of an initial voltage (ini.) was measured.

TABLE 2

<MPRT Data at Over/Under Shoot Ratio of 10%>
<Over/Under Shoot 10% 에서의 MPRT Data>
BET (msec)

|        | Ini: 0 | Ini: 1 | Ini: 2 | Ini: 3 | Ini: 4 | Ini: 5 | Ini: 6 |
|--------|--------|--------|--------|--------|--------|--------|--------|
| Fin: 0 | —      | —      | 9.0    | 8.9    | 9.0    | 9.1    | 9.4    |
| Fin: 1 | —      | —      | 7.0    | 7.6    | 7.6    | 8.2    | 9.0    |
| Fin: 2 | 7.6    | 7.4    | —      | 7.6    | 7.6    | 7.0    | 8.2    |
| Fin: 3 | 7.6    | 7.9    | 7.6    | —      | 7.7    | 7.5    | 7.6    |
| Fin: 4 | 7.6    | 7.7    | 7.7    | 7.7    | —      | 7.6    | 7.7    |
| Fin: 5 | 7.6    | 7.7    | 7.7    | 7.6    | 7.6    | —      | 7.8    |
| Fin: 6 | 8.9    | 8.9    | 8.8    | 8.8    | 8.6    | 8.6    | —      | average 8.0

TABLE 3

<MPRT Data at Over/Under Shoot Ratio of 5%>
<Over/Under Shoot 50% 에서의 MPRT Data>
BET (msec)

|        | Ini: 0 | Ini: 1 | Ini: 2 | Ini: 3 | Ini: 4 | Ini: 5 | Ini: 6 |
|--------|--------|--------|--------|--------|--------|--------|--------|
| Fin: 0 | —      | —      | 9.0    | 9.0    | 9.0    | 9.1    | 9.4    |
| Fin: 1 | —      | —      | 6.0    | 6.9    | 7.6    | 8.2    | 9.1    |
| Fin: 2 | 6.1    | 6.2    | —      | 5.9    | 6.2    | 6.8    | 8.1    |
| Fin: 3 | 6.0    | 6.1    | 6.0    | —      | 6.0    | 6.0    | 7.2    |
| Fin: 4 | 6.0    | 6.0    | 6.1    | 6.0    | —      | 6.1    | 6.2    |
| Fin: 5 | 5.9    | 6.0    | 5.9    | 5.9    | 6.0    | —      | 6.2    |
| Fin: 6 | 8.9    | 8.9    | 8.6    | 8.6    | 8.6    | 8.3    | —      | average 7.1

Figure 4:
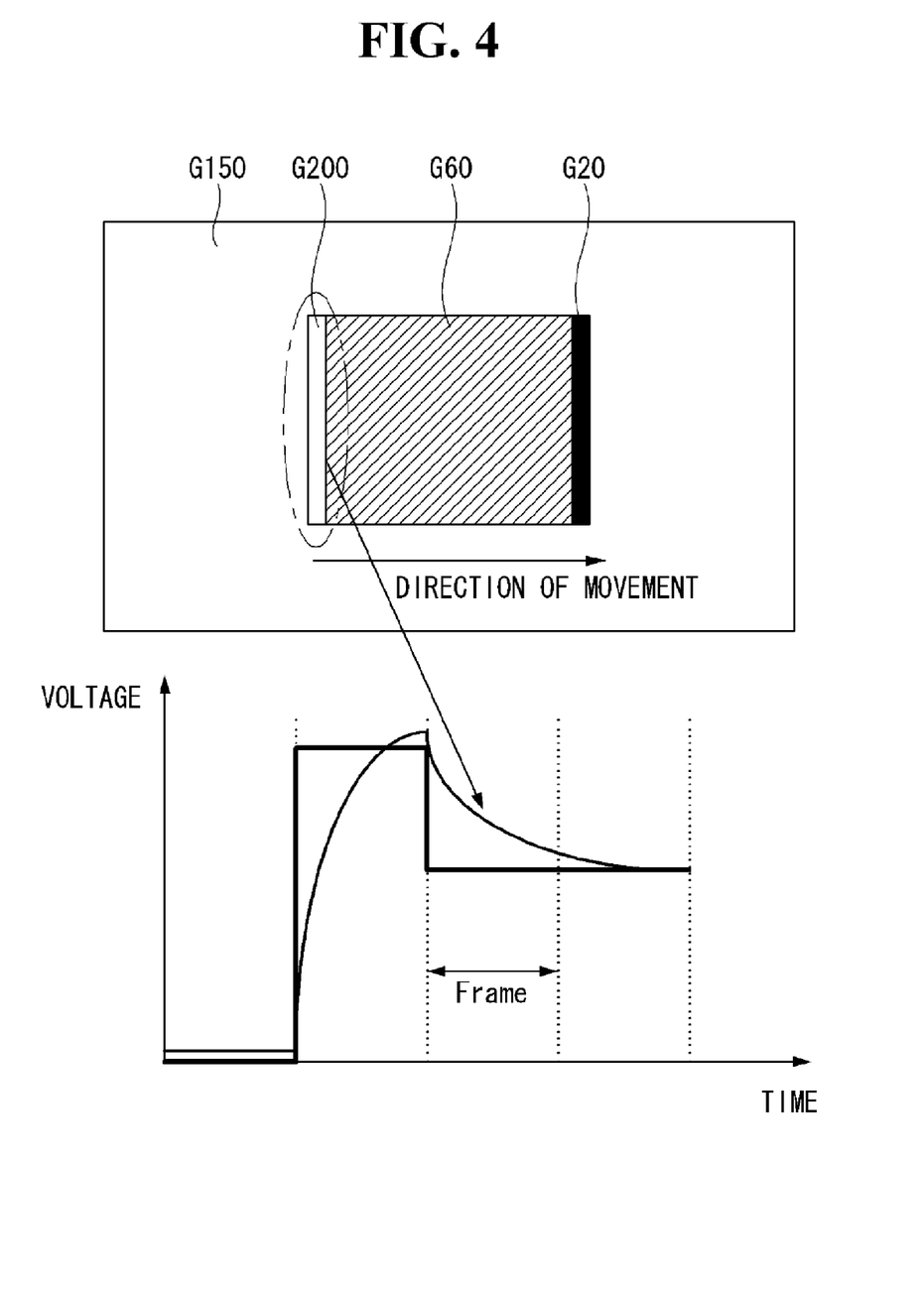
FIG. 4 is a waveform diagram showing a change of a data voltage when data is modulated at an over/under shoot ratio of 50% in a 1 frame over-driving method.
Figure 5:
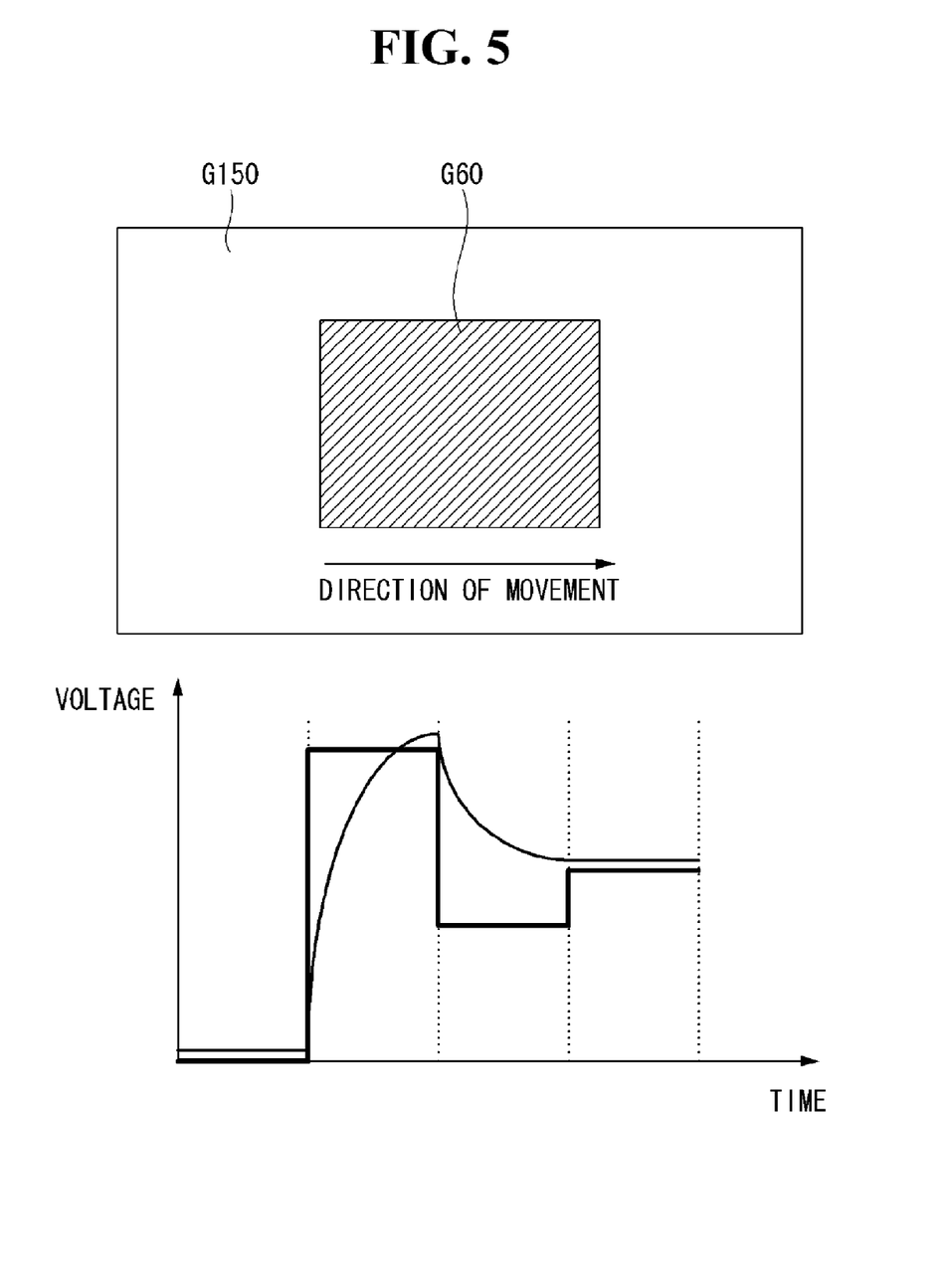
FIG. 5 is a waveform showing a change of a data voltage when data is modulated at an over/under shoot ratio of 50% in a 2 frame over-driving method.

As can be seen from the experimental results, the response time of liquid crystal was shortened when the over/under shoot ratio was increased to 50%, while in a 1 frame over-driving method for modulating current frame data only, motion blurring was observed when the over/under shoot ratio was increased to 50%. As shown in FIG. 4, if a block including a dark gray scale, an intermediate gray scale, and a bright gray scale is moved to the right on the background screen of a bright gray scale G150, a voltage applied to a liquid crystal cell is changed from a voltage with an intermediate gray scale value 'G60' to a voltage with a higher gray scale value 'G200'. By applying the 1 frame over-driving method using an increased over/under shoot ratio of 50% to such a motion picture, motion blurring was observed on the boundary (within the circle) of the picture as shown in FIG. 5.

On the other hand, in a 2 frame over-driving method, almost no motion blur appears on a motion picture while increasing the improvement effect of motion picture response time at an increased over/under shoot ratio of 50%. Here, the 2 frame over-driving method refers to comparing previous frame data and current frame data, modulating the current frame data according to a comparison result, and then modulating currently input frame data by comparing the modulated previous frame data and the currently input frame data in the next frame.

Figure 7:
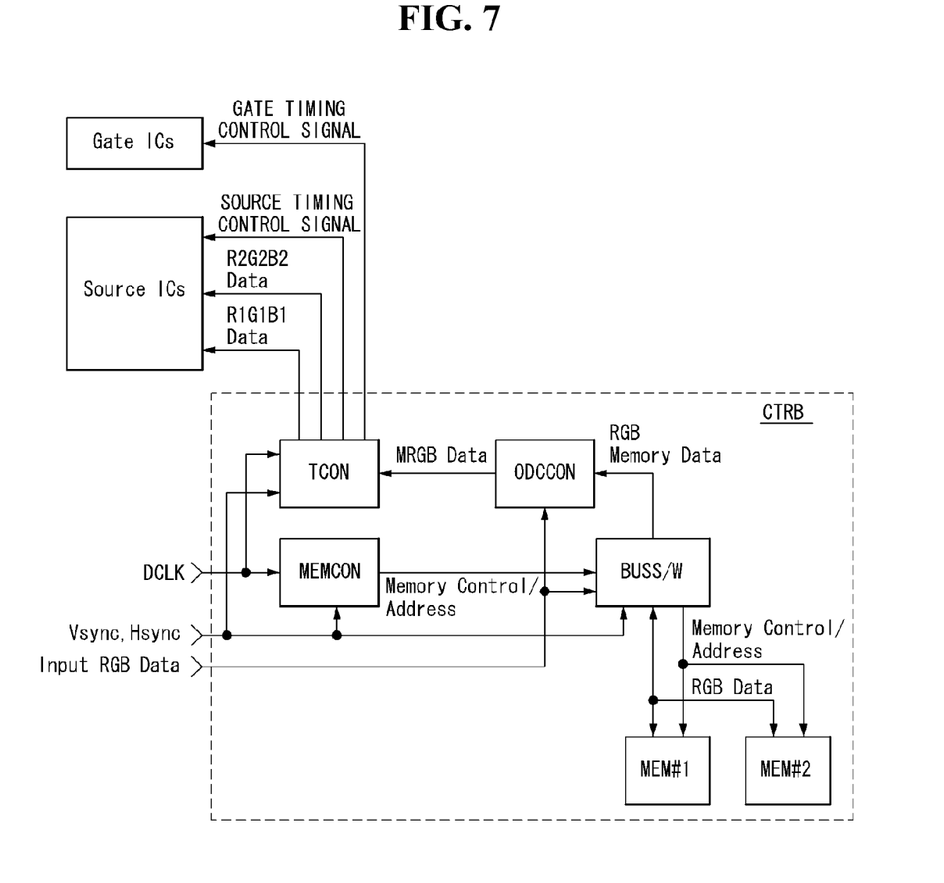
FIG. 7 is a block diagram representing in detail a control board shown in FIG. 6.

If a block of a dark gray scale G60 is moved to the right on the background screen of a bright gray scale G150, a voltage applied to a liquid crystal cell is changed from a voltage with a dark gray scale value 'G60' to a voltage with a higher gray scale value 'G150'. In the 2 frame over-driving method, when such a motion picture is input, current frame data is modulated to a gray scale value higher by the over/under shoot ratio of 50% than the gray scale value 'G150' by comparing the gray scale value 'G60' of previous frame data and the gray scale value 'G150' of the current frame data, and then modulated to a gray scale value lower by the over/under shoot ratio of 50% than the gray scale value G150. As a result, as shown in FIG. 7, in the 2 frame over-driving method, no motion blur is visible even if data is modulated at an over/under shoot ratio of 50%.

To implement the 2 frame over-driving method, a memory for storing modulated previous frame data for comparison between the modulated previous frame and current frame data is required, as well as a memory for storing previous data for comparison between the previous frame data and current frame data. The present invention provides a 2 frame over-driving method capable of increasing an over/under shoot ratio without an additional memory. Hereinafter, an exemplary embodiment of the present invention will be described in conjunction with FIGS. 6 to 14.

While the following exemplary embodiment will be described mainly with respect to an over-driving method using an over/under shoot ratio of 50%, the over/under shoot ratio of the present invention is not limited to 50% but may be appropriately selected within the range of 20 to 80%.

Figure 6:
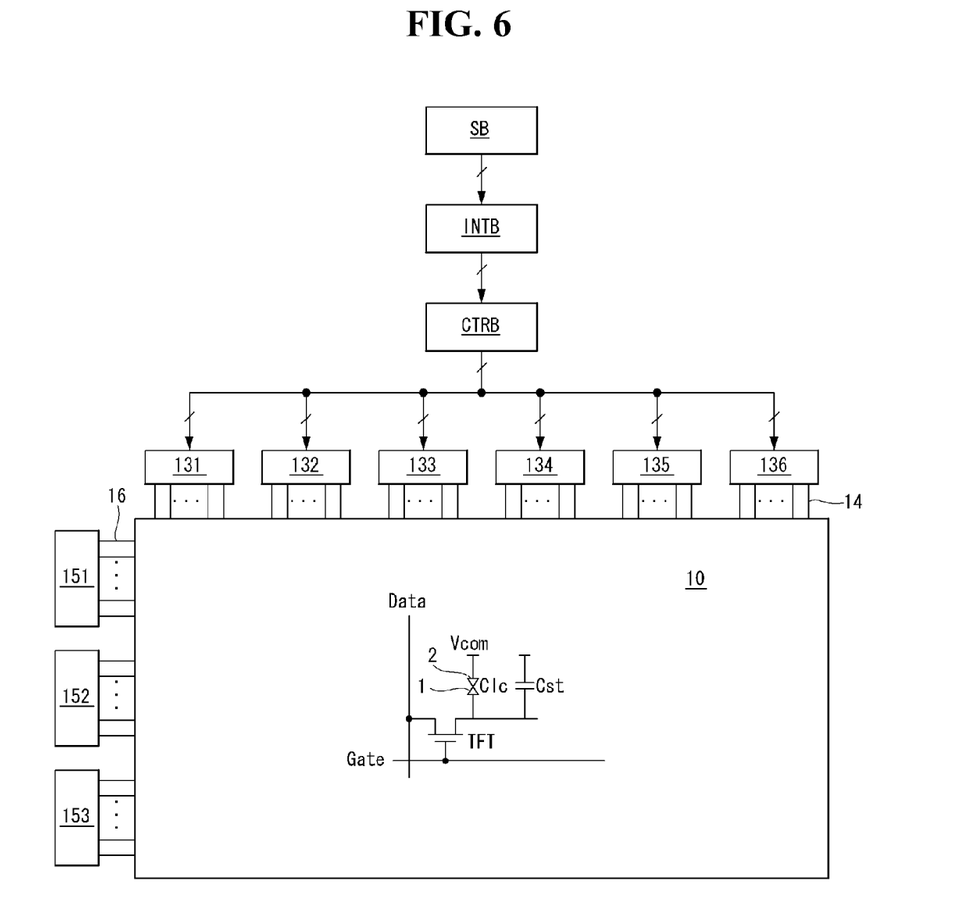
FIG. 6 is a block diagram representing a liquid crystal display according to an exemplary embodiment of the present invention.

Referring to FIG. 6, a liquid crystal display according to the exemplary embodiment of the present invention includes a liquid crystal display panel 10, a plurality of gate drive integrated circuits (ICs) 151 to 153, a plurality of source drive integrated circuits (ICs) 131 to 136, a system board SB, an interface board INTB, and a control board CTRB.

In the liquid crystal display panel 10, a liquid crystal layer is formed between two glass substrates. Liquid crystal cells of the liquid crystal display panel 10 are disposed in a matrix at crossings of data lines 14 and gate lines 16.

On the lower glass substrate of the liquid crystal display panel 10, data lines 14, gate lines 16, TFTs, liquid crystal cells Clc connected to the TFTs and driven by an electric field between pixel electrodes 1 and common electrodes 2, storage capacitors Cst, and the like, are formed.

Black matrixes, color filters, and common electrodes 2 are formed on the upper glass substrate of the liquid crystal display panel 10.

The common electrodes 2 are formed on the upper glass substrate to implement a vertical electric field driving method, such as a twisted nematic (TN) mode or a vertical alignment (VA) mode, and formed on the lower glass substrate together with the pixel electrodes 1 to implement a horizontal electric field driving method, such as an in-plane switching (IPS) mode or a fringe field switching (FFS) mode. Polarizers on which optical axes are perpendicular to each other are attached on the upper and lower glass substrates of the liquid crystal display panel 10, and alignment films are formed at an interface contacting liquid crystal to set a pre-tilt angle for the liquid crystal.

The liquid crystal mode of the liquid crystal display panel 10 applicable in the present invention may be implemented as any liquid crystal mode, as well as the above-stated TN mode, VA mode, IPS mode, and FFS mode. Moreover, the liquid crystal display of the present invention may be implemented in any form including a transmissive liquid crystal display, a semi-transmissive liquid crystal display, and a reflective liquid crystal display. The transmissive liquid crystal display and the semi-transmssive liquid crystal display require a backlight unit which is omitted in the drawings.

The source drive ICs 131 to 136 receive digital video data transmitted by a mini low-voltage differential signaling (LVDS) method, from the control board CTRB, converts the data into analog data voltages in response to a data timing control signal from the control board CTRB, and supplies the data to the data lines 14 of the liquid crystal display panel 10.

Each of the gate drive ICs 151 to 153 generates a gate pulse (or scan pulse) in response to a gate timing control signal from the control board CTRB and sequentially supplies the gate pulse to the gate lines 16.

The system board SB converts the resolution of the digital video data in accordance with the resolution of the liquid crystal display panel 10, and sends timing signals, along with the digital video data, to the interface board INTB. The timing signals include vertical and horizontal synchronization signals Vsync and Hsync, a data enable signal DE, and a dot clock signal DCLK.

The interface board INTB transmits the digital video data and timing signals input from the system board SB to the control board CTRB by the LVDS interface method.

The control board CTRB generates a source timing control signal for controlling the operation timing of the source drive ICs 131 to 136 and a gate timing control signal for controlling the operation timing of the gate drive ICs 151 to 153 by using the timing signals. In addition, the control board CTRB modulates the digital video data by the 2 frame over-driving method and transmits the data to the source drive ICs 131 to 136.

FIG. 7 illustrates the control board CTRB in detail.

Referring to FIG. 7, the control board CTRB includes a timing controller TCON, a memory controller MEMCON, a bus switch BUSS/W, memories MEM#1 and MEM#2, and an over-driving controller ODCCON.

The timing controller TCON counts timing signals, such as a vertical sync signal Vsync, a horizontal sync signal Hsync, and a dot clock signal DCLK and generates a source timing control signal and a gate timing control signal. And, the timing controller TCON separates modulated data MRGB input from the over-driving controller into odd pixel data R1G1B1 and even pixel data R2G2B2 and transmits them to the source drive ICs.

The memory controller MEMCON generates a memory control/address signal synchronized with timing signals, such as a vertical sync signal Vsync, a horizontal sync signal Hsync, and a dot clock signal DCLK, and transmits it to the bus switch BUS S/W.

The bus switch S/W receives vertical and horizontal synchronization signals Vsync and Hsync and a memory control/address signal along with input digital video data RGB. The bus switch BUSS/W supplies the memory control/address signal to the memories MEM#1 and MEM#2, and also supplies the input digital video data RGB to the memories MEM#1 and MEM#2 in synchronization with the vertical and horizontal synchronization signals Vsync and Hsync.

Also, the bus switch BUS S/W transmits the data RGB input from the memories MEM#1 and MEM#2 to the over-driving controller ODCCON.

The over-driving controller ODCCON is connected to input data lines, the bus switch BUSS/W, and the timing controller TCON. The over-driving controller ODCCON includes a look-up table having modulation data registered for each gray scale. This over-driving controller ODCCON receives current frame data RGB input from the input data lines and previous frame data RGB stored in the memories MEM#1 and MEM#2 from the bus switch BUSS/W as a read address of the look-up table, selects the modulated data MRGB registered in the look-up table in accordance with the read address, and supplies it to the timing controller TCON. The data MRGB by the over-driving controller ODCCON satisfies the following equations 3 to 5, that is, over-driving conditions.

$$Fn(RGB)<Fn-1(RGB) \text{--->} Fn(MRGB)<Fn(RGB) \quad \text{[Equation 3]}$$

$$Fn(RGB) \approx Fn-1(RGB) \text{--->} Fn(MRGB)=Fn(RGB) \quad \text{[Equation 4]}$$

$$Fn(RGB)>Fn-1(RGB) \text{--->} Fn(MRGB)>Fn(RGB) \quad \text{[Equation 5]}$$

In Equations 3 to 5, Fn(RGB) is digital video data RGB of the current frame Fn input from the input data lines, and Fn−1(RGB) is digital video data RGB of the previous frame Fn−1 input Via the bus switch BUSS/W. The digital video data RGB of the previous frame Fn−1 read from the memories MEM#1 and MEM#2 via the bus switch BUS S/W may be firstly modulated data or unmodulated data according to a result of comparison with the second previous frame Fn-2. The least significant 1 bit of the digital video data RGB of the previous frame Fn−1 read from the memories MEM#1 and MEM#2 indicates whether to firstly modulate or not according to its value. Fn(MRGB) is digital video data which is modulated by the over-driving controller ODCCON and input into the timing controller TCON.

If a pixel data value in the same pixel becomes higher in the current frame Fn than in the previous frame Fn−1 by two gray scales or more, the data MRGB modulated by the over-driving controller ODCCON has a higher value than the data of the current frame Fn by an over/under shoot ratio of 50%. If the pixel data value in the same pixel becomes lower in the current frame Fn than in the previous frame Fn−1 by two gray scales or more, the data MRGB modulated by the over-driving controller ODCCON has a lower value than the data of the current frame Fn by an over/under shoot ratio of 50%. If there is a difference in the pixel data value in the same pixel between in the current frame Fn and in the previous frame Fn−1 by less than two gray scales, that is, the pixel data value is the same or only the least significant bit is different, the data MRGB modulated by the over-driving controller ODCCON is data of the current frame Fn whose least significant 1 bit is substituted by '0'.

The 2 frame over-driving method according to the exemplary embodiment of the present invention will be described below step by step.

Figure 8:
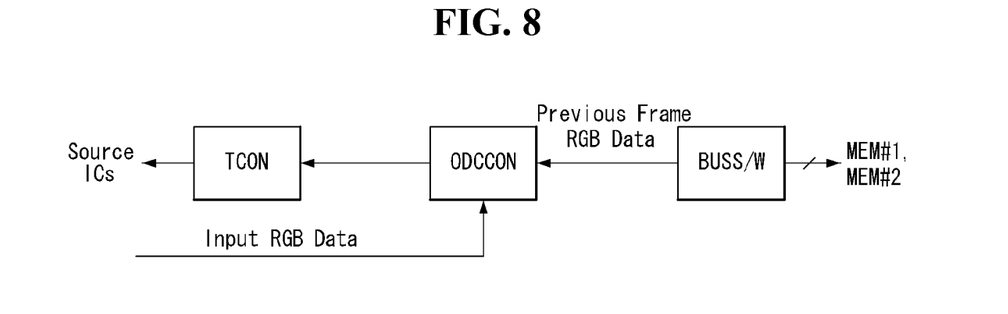
FIGS. 8 to 11 are block diagrams representing step by step a 2 frame over-driving modulation process in the liquid crystal display according to the exemplary embodiment of the present invention.
Figure 9:
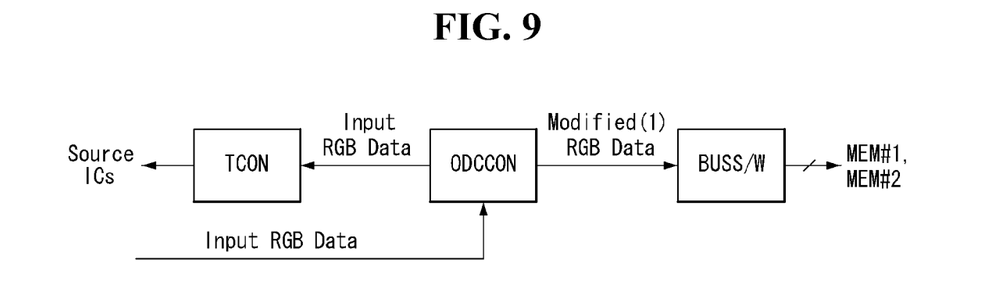

The over-driving controller ODCCON determines whether to apply over-driving or not by comparing input digital video data RGB and previous frame data read from the memory MEM#1 and MEM#2 as shown in FIG. 8.

If the difference between the digital video data RGB input during an (N)th frame period (N is a positive integer) and the data input into the previous frame ((N−1)th frame) and stored in the memories MEM#1 and MEM#2 is less than two gray scales, the over-driving controller ODCCON modulates the least significant bit in currently input digital video data into '0', stores the data (Modified(1) RGB Data) in the memories MEM#1 and MEM#2, and supplies the input digital video data RGB to the timing controller TCON as it is. Of course, the input digital video data RGB whose least significant 1 bit value is '0' is stored as it is in the memories MEM#1 and MEM#2 without conversion of the least significant bit value.

For example, if the gray scale of the digital video data RGB input during the (N)th frame is "101(011001012)" and if the difference between the gray scale of the previous data and the gray scale of the input digital video data RGB is less than two gray scales, the over-driving controller ODCCON substitutes the least significant bit of the input digital video data RGB into '0' and generates "100(011001002) as data (Modified(1) RGB Data) that is to be stored in the memories MEM#1 and MEM#2. And, the over-driving controller ODCCON supplies the input digital video data RGB of "100(011001012)" to the timing controller TCON as it is. Meanwhile, the over-driving controller ODCCON reads the least significant bit of the data (Modified(1) RGB Data) input from the memories MEM#1 and MEM#2 from the next frame, that is, the bus switch BUSS/W, and if the least significant bit is '0', determines that the data is data not modulated in the previous frame.

Figure 10:
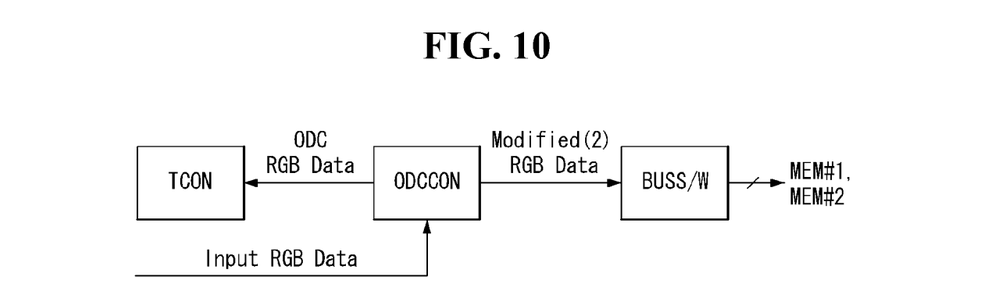

If the difference between the digital video data RGB input during the (N)th frame period and the previous frame data ((N−1)th frame data) read from the memories MEM#1 and MEM#2 is two gray scales or more, the over-driving controller ODCCON selects modulated data ODC RGB, which is modulated at an over/under shoot ratio of 50% larger than that of the currently input data RGB while satisfying Equations 3 and 5 as shown in FIG. 10, from the look-up table and supplies it to the timing controller TCON. And, the over-driving controller ODCCON converts the least significant 1 bit value of the modulated data ODC RGB into '1" to generate firstly modulated data (Modified(2) RGB Data) and transmits the data (Modified(2) RGB Data) to the memories MEM#1 and MEM#2. Of course, the modulated data ODC RGB, whose least significant 1 bit value is '1', is transmitted as it is to the memories MEM#1 and MEM#2. If the least significant 1 bit of the data (Modified(2) RGB Data) thusly stored in the memories MEM#1 and MEM#2 is '1', the over-driving controller ODCCON determines that the data (Modified(2) RGB Data) is firstly modulated data in the next frame in which the data (Modified(2) RGB Data) is loaded on the over-driving controller ODCCON.

For example, if the gray scale of the digital video data RGB input during the (N)th frame is "100(011001002)" and the gray scale of the previous data read from the memories MEM#1 and MEM#2 is "30(000111102)", the over-driving controller ODCCON generates data ODC RGB, which is modulated at an over/under shoot ratio of 50% larger than that of the input digital video data RGB, as "176(101100002)", and supplies the data ODC RGB to the timing controller TCON. And, in order to indicate that first modulation has been performed, the over-driving controller ODCCON converts the least significant 1 bit value of the modulated data ODC RGB into '1' to generate data {Modified(2) RGB Data} of "177(101100012)" and transmits the data {Modified(2) RGB Data} to the memories MEM#1 and MEM#2.

Figure 11:
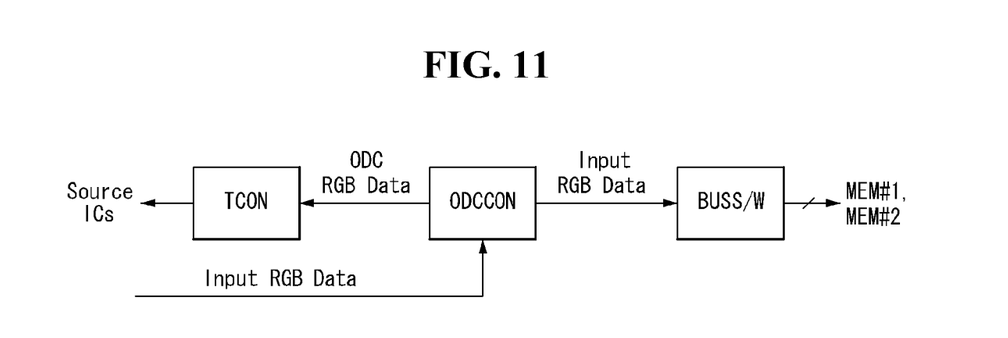

If the difference between the digital video data RGB input during an (N+1)th frame period and the firstly modulated data {Modified(2) RGB Data} of the previous frame read from the memories MEM#1 and MEM#2 is two gray scales or more, the over-driving controller ODCCON selects modulated data ODC RGB, which is modulated at an over/under shoot ratio of 50% larger than that of the currently input data RGB while satisfying Equations 3 and 5 as shown in FIG. 11, from the look-up table and supplies it to the timing controller TCON.

And, the over-driving controller ODCCON reads the least significant 1 bit of the firstly modulated data (Modified(2) RGB Data), and if the least significant 1 bit value is '1", stores the input digital video data RGB in the memories MEM#1 and MEM#2 and converts the least significant bit value of the data RGB into '0'. This is for allowing the over-driving controller ODCCON to determine that the data read from the memories MEM#1 and MEM#2 is unmodulated data in the next frame.

For example, if the gray scale of the digital video data RGB input during the (N+1)th frame is "100(011001002)" and the gray scale of the (N)th frame data read from the memories MEM#1 and MEM#2 is "177(101100012)", the over-driving controller ODCCON generates data ODC RGB, which is modulated at an over/under shoot ratio of 50% larger than that of the input digital video data RGB and satisfies Equation 3, as "80(010100002)", and supplies the data ODC RGB to the timing controller TCON. And, since the least significant 1 bit of the input digital video data RGB is '0', the over-driving controller ODCCON transmits the data RGB as it is to the memories MEM#1 and MEM#2.

Because an over-driving modulation operation is carried out during two frame periods as discussed above, the over-driving controller ODCCON does not carry out the over-driving modulation unless the difference between the input digital video data RGB and the data read from the memories MEM#1 and MEM#2 is two gray scales or more in the next frame.

However, in the 2 frame over-driving method explained in the foregoing exemplary embodiment, the least significant 1 bit of digital video data store din the memories indicates whether to perform an over-driving modulation or not, and hence if a conventional compression technique is employed, it cannot be found whether the data stored in the memories MEM#1 and MEM#2 is firstly modulated or not. This is because the conventional data compression technique generates only compression-related information required for data restoration. Hereinafter, a data compression/restoration method and apparatus suitable for the 2 frame over-driving method according to the exemplary embodiment of the present invention will be described.

Figure 12:
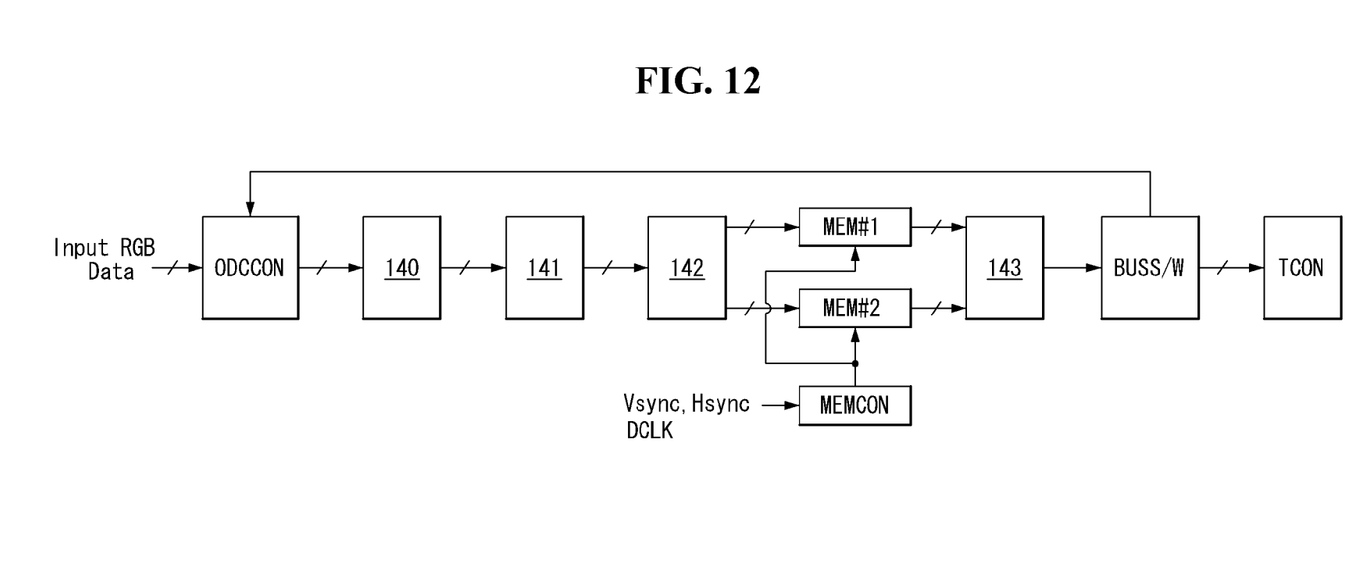
FIG. 12 is a block diagram representing a data compressor of the present invention.

FIG. 12 shows a data compression/restoration apparatus according to the exemplary embodiment of the present invention.

Referring to FIG. 12, the data compression/restoration apparatus according to the present invention includes a memory unit 140, a data compressor 141, and a data aligner 142 connected between the over-driving controller ODCCON and the memories MEM#1 and MEM#2. Further, the data compression/restoration apparatus of the present invention includes a data restoring part 143 connected between the memories MEM#1 and MEM#2 and the timing controller TCON.

The memory unit 140 receives data from the over-driving controller ODCCON and stores data for i number of lines (i is a positive integer) and supplies an (i×j) number of pixel bitmap blocks (j is a positive integer) to the data compressor 141. The data compressor 141 compresses data from the memory unit 140 according to a compression algorithm to generate compressed data including over-driving modulation information, and supplies the compressed data to the data aligner 142. The compression algorithm of the data compressor 141 may include a BTC (Block Truncation Coding) algorithm, a vector quantizer algorithm, and so on, but is not limited thereto and may include any algorithm that coverts pixel data.

The data aligner 142 stores the compressed data from the data compressor 141 according to a memory clock and the number of input channels of the memories MEM#1 and MEM#2. The data restoring part 143 restores the compressed data read from the memories MEM#1 and MEM#2 by a restoration algorithm corresponding to the compression algorithm.

Figure 15:
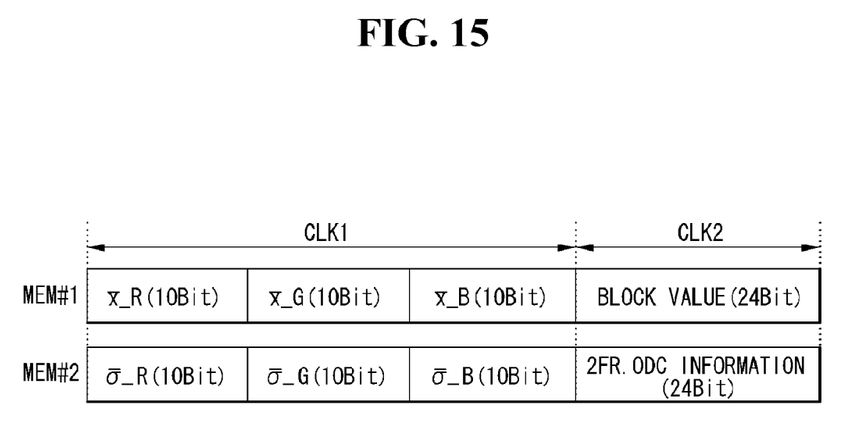
FIG. 15 is a view showing a data format of compressed data and over-driving modulation information supplied to a memory during two clock periods of the memory in the data compressor of FIG. 14.

In the case of applying the BTC algorithm, the data compression/restoration apparatus of the present invention compresses 4×2 pixel data blocks by the BTC compression algorithm as shown in FIG. 15. In this case, the memory unit 140 includes two line memories for storing two lines.

Figure 14:
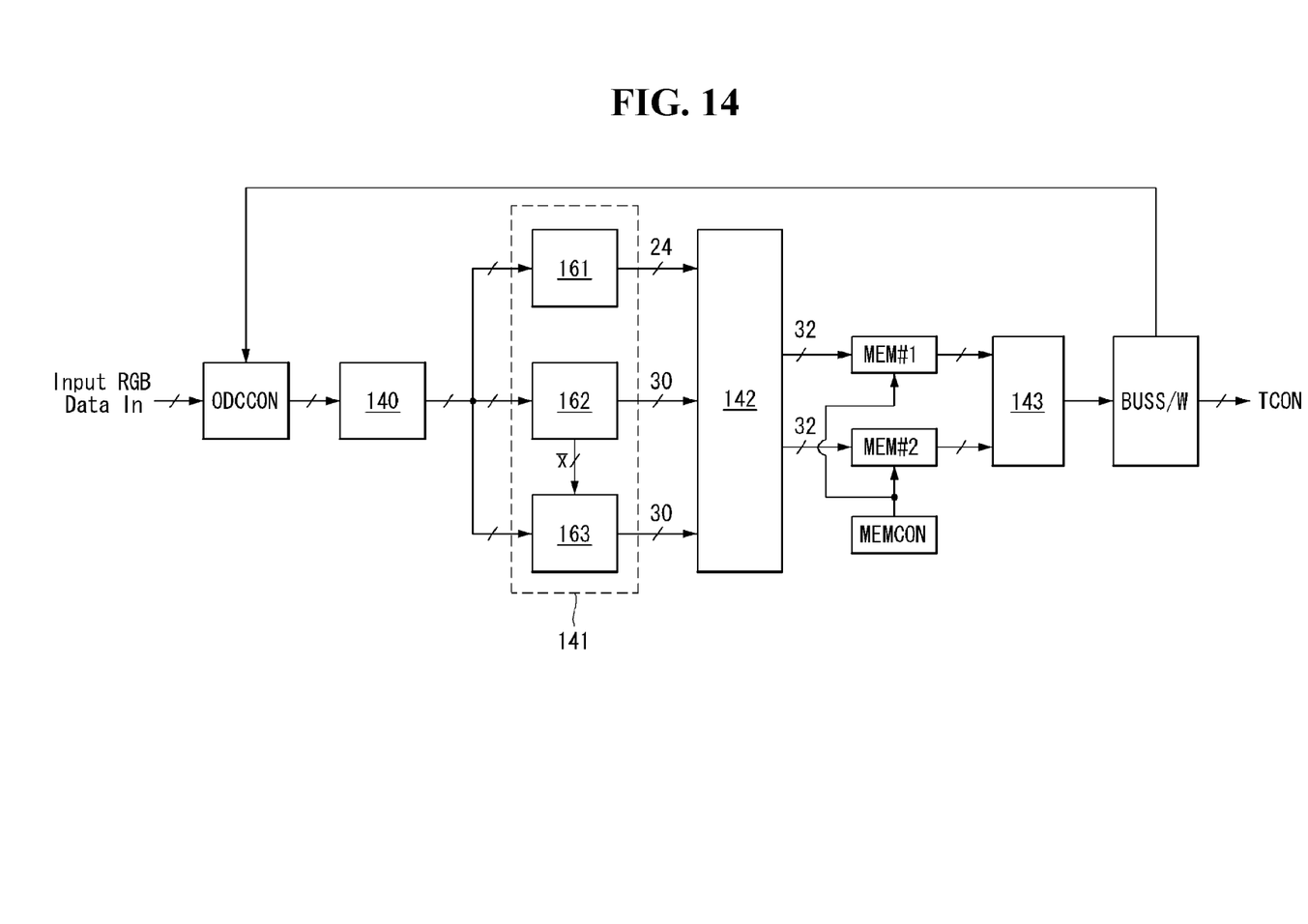
FIG. 14 is a block diagram representing an example of the data compressor shown in FIG. 12 implemented by the BTC compression algorithm.

Referring to FIG. 14, the data compressor 141 includes an over-driving modulation information encoder 161, an average value calculator 162, a dispersion value calculator 163, and a compressed data encoder and data aligner 142.

Figure 13:
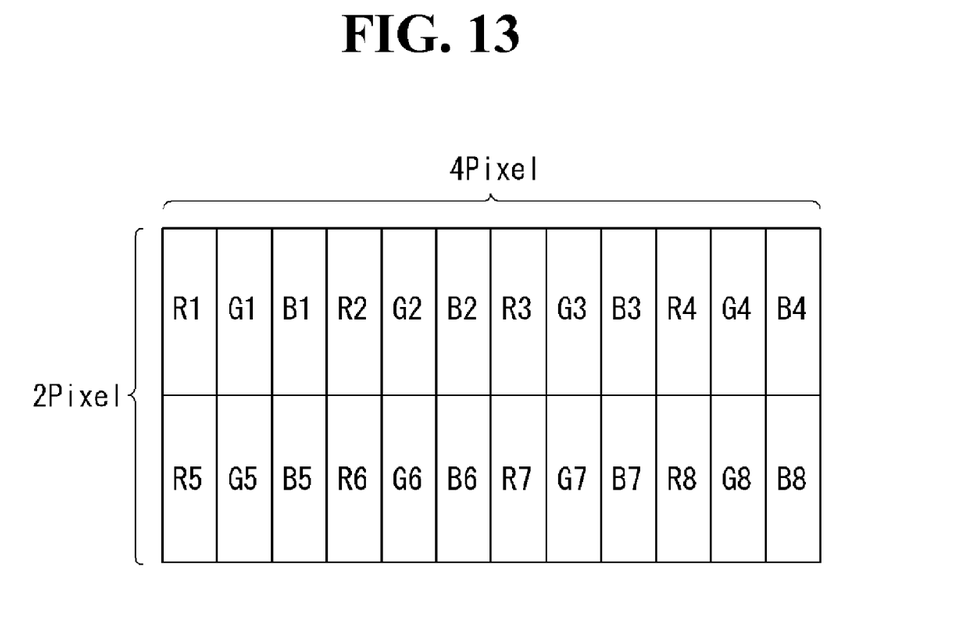
FIG. 13 is a view representing an example of a data block of a BTC compression algorithm.

The over-driving modulation information encoding unit 161 encodes 1 bit information for identifying whether or not each of the 4×2 pixel bitmap blocks shown in FIG. 13 is over-driven and generates over-driving modulation information of 24 bits per block.

The average value calculator 162 calculates an average value ($\bar{x}$) of the 4×2 pixel bitmap blocks as seen from the following Equation 6.

$$\bar{x} = \frac{1}{n}\sum_{i=1}^{n} x_i \quad \text{[Equation 6]}$$

Wherein n represents the number of pixel values included in the pixel bitmap blocks, for example, 8 in an example of the pixel bitmap block of FIG. 13. xi represents each of (i)th pixel values included in the pixel bitmap blocks.

The dispersion value calculator 163 calculates a dispersion value (σ) of the 4×2 pixel bitmap blocks as seen from the following Equation 7.

$$\sigma = \sqrt{\frac{1}{n}\sum_{i=1}^{n}(x_i - \bar{x})^2} \quad \text{[Equation 7]}$$

A signal delay unit for synchronizing with an output of the dispersion value calculator 163 may be connected between the over-driving modulation information encoding unit 161 and the data aligner 142. Also, a signal delay unit for synchronizing with an output of the dispersion value calculator 163 may be connected between the average value calculator 162 and the data aligner 142.

The compression data encoding and data aligner 142 compares each of the pixel values of k bits (k is an integer of 6 or more) in the 4×2 pixel bitmap blocks with the average value, substitutes pixel values below the average value into '0', and compresses each of the pixel values into 1 bit. Accordingly, the compressed data encoding and data aligner 142 generates a block value of a total of 24 bits including the 1 bit pixel values of the 4×2 pixel bitmap blocks.

According to the memory clock CK1 as shown in FIG. 15 the compressed data encoding and data aligner 142 supplies the memories MEM#1 and MEM#2 with an average value of a total of 30 bits, with 10 bits allocated for each of RGB, a dispersion value of a total of 30 bits, with 10 bits allocated for each of RGB, a block value of a total of 24 bits provided as one bit per RGB, and over-driving modulation information ODC of 24 bits. The compressed data encoding and data aligner 142 transmits data of a total of 32 bits containing the average value of 30 bits and dummy 2 bits to the first memory MEM#1 in synchronization with the first memory clock CLK1 according to 32 input channels of the memories MEM#1 and MEM#2, and at the same time transmits data of a total of 32 bits containing the dispersion value of 30 bits and dummy 2 bits to the second memory MEM#2. Also, the compressed data encoding and data aligner 142 transmits data of a total of 32 bits containing the block value of 24 bits and dummy 8 bits in synchronization with a second memory block CLK2, and transmits data of a total of 32 bits containing the over-driving modulation information ODC of 24 bits and dummy 8 bits to the second memory MEM#2. 4×2 pixel bitmap blocks The data restoring part 143 restores each of the pixel values of the 4×2 pixel bitmap blocks on the basis of Equations 8 and 9 which use the pixel values of 0 or 1 contained in the average value, dispersion value, and block value input from the memories MEM#1 and MEM#2 as variables, and adds the over-driving modulation information ODC of the least significant 1 bit to each of the pixel values.

$$H = \bar{x} + \sigma\sqrt{\frac{p}{q}} \quad \text{[Equation 8]}$$

$$L = \bar{x} - \sigma\sqrt{\frac{q}{p}} \quad \text{[Equation 9]}$$

In Equations 8 and 9, H represents a restored value when a pixel value of the compressed data is 1, and L represents a restored value when a pixel value of the compressed data is 1, p represents the number of pixel values '0' in the block value, and q represents the number of pixel values '1' in the block value.

In the liquid crystal display and method for driving the same according to the exemplary embodiment of the present invention, a 2 frame over-driving modulation operation can be carried out without an additional memory by using a specific bit of the data stored in the memories as an identification bit for indicating whether to perform modulation or not, and the improvement effect of motion picture response time can be increased by modulating data at an over/under shoot ratio of 20% or more.

From the foregoing description, those skilled in the art will readily appreciate that various changes and modifications can be made without departing from the technical idea of the present invention. Therefore, the technical scope of the present invention is not limited to the contents described in the detailed description of the specification but defined by the appended claims.

What is claimed is:

1. A liquid crystal display, comprising:
    a liquid crystal display panel including a plurality of data lines, a plurality of gate lines crossing the data lines, and a plurality of liquid crystal cells;
    a data driving circuit for supplying data voltages to the data lines;
    a gate driving circuit for supplying gate pulses to the gate lines;
    a timing controller for supplying data to the data driving circuit and controlling the data driving circuit and the gate driving circuit; and
    an over-driving controller which, if a difference between input data input during a (N)th frame period (N is a positive integer) and (N−1)th frame data read from a memory is 2 gray levels or more, modulates the data at an over/under shoot ratio of 20% to 80% and supplies the modulated data to the timing controller, if the difference is less than 2 gray levels, supplies the input data to the timing controller, and differently converts a least significant bit of the data stored in the memory according to whether or not the data is modulated, wherein if the data difference during the (N)th frame period is two gray scales or more, the over-driving controller supplies the data modulated at 20% to 80% to the timing controller and converts only the least significant bit in the modulated data to '1' and stores the same in the memory.

2. The liquid crystal display of claim 1, wherein if a difference between a data input during a (N+1)th frame period and the data read from the memory is two gray scales or more, the over-driving controller secondly modulates the data input during the (N+1)th frame period at an over/under shoot ratio of 20% to 80%, supplies the secondly modulated data to the timing controller, converts only the least significant bit in the data input during the (N+1)th frame period to '0', and stores the same in the memory.

3. The liquid crystal display of claim 2, wherein if a difference between the data input during a (N+2)th frame period and the data read from the memory is less than two gray scales, the over-driving controller supplies the data input during the (N+2)th frame period as it is to the timing controller, converts only the least significant bit in the data input during the (N+2)th frame period to '0' and stores the same in the memory.

4. The liquid crystal display of claim 1, further comprising:
a data compressor connected between the over-driving controller and the memory to compress an output of the over-driving controller and generate an over-driving modulation information indicating whether to perform over-driving modulation for each of the data; and
a data restoring part connected between the memory and the timing controller to restore the compressed data and add the over-driving modulation information to each of the restored data.

5. A driving method of a liquid crystal display including a liquid crystal display panel including a plurality of data lines, a plurality of gate lines crossing the data lines, and a plurality of liquid crystal cells; a data driving circuit for supplying data voltages to the data lines; a gate driving circuit for supplying gate pulses to the gate lines; and a timing controller for supplying data to the data driving circuit and controlling the data driving circuit and the gate driving circuit, the method comprising:
if a difference between input data input during a (N)th frame period (N is a positive integer) and (N−1)th frame data read from a memory is 2 gray levels or more, modulating the data at an over/under shoot ratio of 20% to 80% and supplying the modulated data to the timing controller;
if the difference is less than 2 gray levels, supplying the input data to the timing controller, and differently converting the least significant bit of the data stored in the memory according to whether or not the data is modulated,
wherein in the supplying of the modulated data to the timing controller, if the data difference during the (N)th frame period is two gray scales or more, the over-driving controller supplies the data modulated at 20% to 80% to the timing controller and converts only the least significant bit in the modulated data to '1' and stores the same in the memory.

6. The method of claim 5, further comprising:
if a difference between a data input during a (N+1)th frame period and the data read from the memory is two gray scales or more, secondly modulating the data input during the (N+1)th frame period at an over/under shoot ratio of 20 to 80% and supplying the secondly modulated data to the timing controller; and
converting only the least significant bit in the data input during the (N+1)th frame period to '0' and storing the same in the memory.

7. The method of claim 6, further comprising:
if a difference between the data input during a (N+2)th frame period and the data read from the memory is less than two gray scales, supplying the data input during the (N+2)th frame period as it is to the timing controller; and
converting only the least significant bit in the data input during the (N+2)th frame period to '0' and storing the same in the memory.

8. The method of claim 5, further comprising:
compressing the data to be stored in the memory to generate a compressed data and generating an over-driving modulation information indicating whether to perform over-driving modulation for each of the data; and
restoring the compressed data and adding the over-driving modulation information to each of the restored data.

* * * * *